United States Patent
Sin et al.

(10) Patent No.: US 8,628,376 B2
(45) Date of Patent: Jan. 14, 2014

(54) IN-LINE WAFER THICKNESS SENSING

(75) Inventors: Garrett H. Sin, San Jose, CA (US);
Sanjeev Jain, Sunnyvale, CA (US);
Boguslaw A. Swedek, Cupertino, CA (US); Lakshmanan Karuppiah, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 940 days.

(21) Appl. No.: 12/610,979

(22) Filed: Nov. 2, 2009

(65) Prior Publication Data
US 2010/0120333 A1    May 13, 2010

Related U.S. Application Data

(60) Provisional application No. 61/112,683, filed on Nov. 7, 2008.

(51) Int. Cl.
   *B24B 49/00*    (2012.01)
(52) U.S. Cl.
   USPC .................................. 451/5; 451/41
(58) Field of Classification Search
   USPC ............... 451/5, 8, 41, 287, 288, 289, 290
   See application file for complete search history.

(56) References Cited

U.S. PATENT DOCUMENTS

| | | | |
|---|---|---|---|
| 4,860,229 A | 8/1989 | Abbe et al. | |
| 5,511,005 A | 4/1996 | Abbe et al. | |
| 5,658,183 A | 8/1997 | Sandhu et al. | |
| 5,679,060 A * | 10/1997 | Leonard et al. | 451/43 |
| 6,132,289 A * | 10/2000 | Labunsky et al. | 451/6 |
| 6,198,294 B1 | 3/2001 | Black | |
| 6,213,848 B1 * | 4/2001 | Campbell et al. | 451/41 |
| 6,413,145 B1 | 7/2002 | Pinson, II et al. | |
| 6,540,591 B1 * | 4/2003 | Pasadyn et al. | 451/41 |
| 6,951,503 B1 | 10/2005 | Gotkis et al. | |
| 7,018,275 B2 * | 3/2006 | Zuniga et al. | 451/41 |
| 7,112,961 B2 * | 9/2006 | Lei et al. | 324/230 |
| 7,156,717 B2 | 1/2007 | Molnar | |
| 7,195,535 B1 * | 3/2007 | Swedek et al. | 451/5 |
| 7,400,934 B2 * | 7/2008 | Birang et al. | 700/30 |

(Continued)

FOREIGN PATENT DOCUMENTS

| | | |
|---|---|---|
| JP | A-H6-295891 | 10/1994 |
| JP | A-H8-216016 | 8/1996 |

(Continued)

OTHER PUBLICATIONS

Korean Authorized Officer, Chang Seok Oh, International Search Report and the Written Opinion in PCT/US2009/063161 mailed Jun. 1, 2010, 10 pages.

(Continued)

*Primary Examiner* — Robert Rose
(74) *Attorney, Agent, or Firm* — Fish & Richardson P.C.

(57) ABSTRACT

A method of forming bare silicon substrates is described. A bare silicon substrate is measured, wherein measuring is performed by a non-contact capacitance measurement device to obtain a signal at a point on the substrate. The signal or a thickness indicated by the signal is communicated to a controller. An adjusted polishing parameter according to the signal or thickness indicated by the signal is determined. After determining an adjusted polishing parameter, the bare silicon substrate is polished on a polisher using the adjusted polishing parameter.

11 Claims, 8 Drawing Sheets

(56) References Cited

U.S. PATENT DOCUMENTS

| | | |
|---|---|---|
| 2002/0164925 A1 | 11/2002 | Swedek et al. |
| 2004/0140797 A1 | 7/2004 | Lei et al. |
| 2007/0063698 A1 | 3/2007 | Lei et al. |
| 2008/0186022 A1 | 8/2008 | Lei et al. |
| 2008/0206993 A1 | 8/2008 | Lee et al. |
| 2009/0149115 A1 | 6/2009 | Palou-Rivera et al. |

FOREIGN PATENT DOCUMENTS

| | | |
|---|---|---|
| JP | A-H9-85619 | 3/1997 |
| JP | A-2002-18704 | 1/2002 |
| JP | A-2003-68689 | 3/2003 |
| JP | 2003-266022 | 9/2003 |
| JP | T 2004-525521 | 8/2004 |
| KR | 10-1998-0069954 | 10/1998 |
| WO | WO 02/41380 | 5/2002 |
| WO | WO 02/087825 | 11/2002 |

OTHER PUBLICATIONS

Telfeyan et al. "A multilevel approach to the control of a chemical-mechanical planarization Process" J. Vac. Sci. Technol. A 14(3), May/Jun. 1996, pp. 1907-1913.

Japanese Office Action in JP Application No. 2011-534888, issued Sep. 17, 2013, 3 pages.

\* cited by examiner

IN-LINE WAFER THICKNESS SENSING

CROSS-REFERENCE TO RELATED APPLICATIONS

This application claims priority to U.S. Provisional Application Ser. No. 61/112,683, filed on Nov. 7, 2008. The disclosure of the prior application is considered part of and is incorporated by reference in the disclosure of this application.

TECHNICAL FIELD

The present invention relates to generally to chemical mechanical polishing of substrates.

BACKGROUND

An integrated circuit is typically formed on a semiconductor substrate or wafer, such as a silicon wafer, by the sequential deposition of conductive, semiconductive, or insulative layers on a silicon wafer. The substrates are cut from a cylinder of silicon, commonly referred to as an ingot. A silicon ingot can be grown using the Czochralski process. The Czochralski process generally requires melting amorphous silicon or polysilicon and dipping a single crystal silicon into the melted silicon. The single crystal silicon allows the melted silicon to form large crystals. The single crystal silicon is then pulled from the melt to form the ingot. The ingot is sliced, such as with a wire saw, to create wafers. Wafers of various diameters, such as about 300 mm, can be created from an ingot formed in this way.

A batch of wafers from an ingot are then each double side polished to make the front and the back of the wafer parallel. The wafers can then be measured to determine their thickness. Once measured, the wafers are again polished to remove damage and correct the wafer's geometry, such as to eliminate waviness. Chemical mechanical polishing (CMP) is one polishing method used on the wafers. Post polishing, the wafers are again measured. The measurements obtained indicate the quality of the wafer. The post polishing measurements are used to categorize or grade the wafers, such as into prime grade, dummy grade, mechanical grade, etc. Each grade of wafer can be sold to manufacturers for producing various end products according to the manufacturer's needs.

SUMMARY

The methods and systems described herein can be used to measure the thickness of a substrate, such as a silicon substrate. A noncontact capacitance metrology tool is integrated into a polishing system. The metrology tool enables obtaining measurements from a silicon substrate, such as a bare or non-processed silicon substrate. In addition, pre- and post-polishing measurements can be obtained and used to control further processing of the substrate or processing of other substrates. The onboard capacitance metrology allows for silicon substrates to be measured directly after polishing instead of having to move the substrate to a separate tool for measuring. This measurements can then be fed into the computer for immediate process control, i.e., closed loop control.

In one aspect, a method of forming substrates is described. A bare silicon substrate is measured, wherein measuring is performed by a non-contact capacitance measurement device to obtain a signal at a point on the substrate. The signal or a thickness indicated by the signal is communicated to a controller. An adjusted polishing parameter according to the signal or thickness indicated by the signal is determined. After determining an adjusted polishing parameter, the bare silicon substrate is polished on a polisher using the adjusted polishing parameter.

In yet another aspect a system is described. The system includes a polishing apparatus having one or more polishing stations for polishing of a substrate, the polishing stations operating with a plurality of polishing parameters and an in-line monitoring system. The in-line monitoring system includes a substrate holder to hold the substrate at a location away from the polishing stations, and a capacitance sensor to generate a signal based on a distance of the substrate to the sensor. The sensor and the substrate holder are configured to undergo relative motion to position the sensor at three or more separated positions adjacent the substrate edge and generate measurements at the three or more separated positions. The system also includes a controller to receive the signal from the sensor and control at least one of the plurality of polishing parameters in response to the signal and substrate storage, wherein the in-line monitoring system is within the substrate storage.

In yet another aspect, the application describes a chemical mechanical polishing system. The system includes a polishing apparatus, a probe, a robot, a controller and a factory interface. The polishing apparatus has one or more polishing stations for polishing of a substrate, the polishing stations operating with a plurality of polishing parameters. The probe is for receiving the substrate and scanning the substrate at one or more locations. The probe includes a capacitance sensor to induce an capacitance at each location and generate a signal indicative of a distance of the substrate from the probe for a corresponding location and a vertical position sensor to determine a vertical distance between the vertical position sensor to the substrate to ensure that the substrate does not contact the capacitance sensor. The sensor and the substrate holder are configured to undergo relative motion to position the sensor at three or more separated positions adjacent the substrate edge and generate measurements at the three or more separated positions. The controller is configured to receive the signal and control at least one of the plurality of polishing parameters in response to the signal. The factory interface has substrate storage. The probe is either in the factory interface or mounted to the factory interface.

Embodiments of the system and methods can include one or more of the following features. A desired thickness of the substrate can be received, wherein determining the adjusted polishing parameter is based on the desired thickness. Measuring can include measuring at least three points along a radius on the substrate or at least three points in an angular zone on the substrate. The adjusted polishing parameter can include a relative rate of rotation between the substrate and a polishing surface. The adjusted polishing parameter can include backside pressure applied to the substrate. Measuring and polishing can be performed on a system where the non-contact capacitance measurement device is in-line with the polisher. The sensor and the substrate holder can be configured to undergo relative motion to scan the sensor along the three or more separated radial segments of the substrate. The sensor can include two capacitance sensors opposite to one another.

The details of one or more implementations of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

In a CMP system, a substrate is polished to have a desired thickness. The substrate can be measured, for example, either before or after polishing by an in-line noncontact capacitance metrology system, as will be described below, that can generate a signal related to a thickness of the substrate, or a bow, warp or flatness of the substrate. Measurements can be performed across the entire substrate, at multiple angularly separated regions, particularly at multiple angularly separated points near the substrate edge, or at various radial locations on the substrate. In one implementation, multiple scans are performed along angularly separated radial or x,y segments of the substrate.

Figure 1:
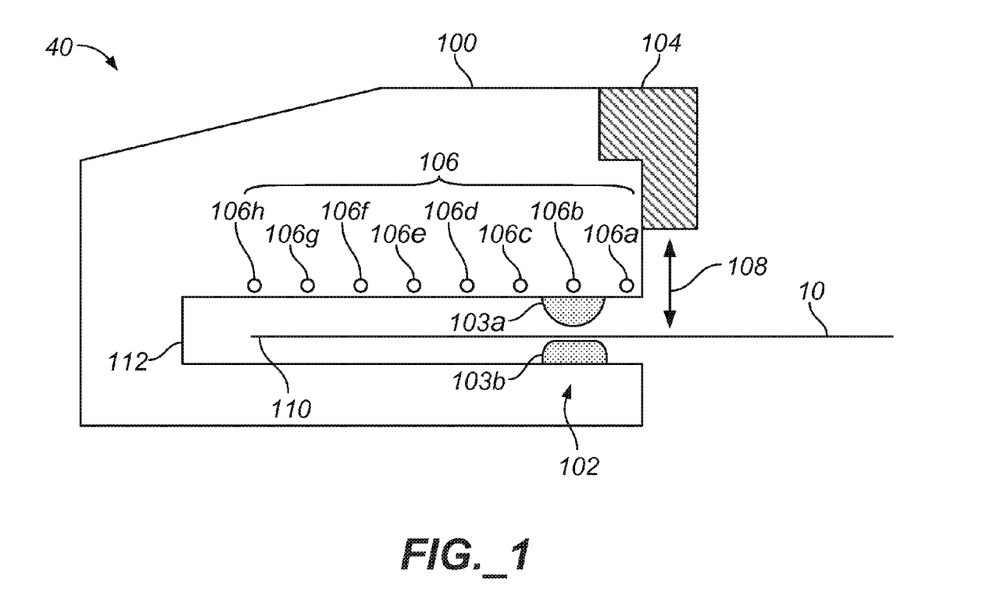
FIG. 1 illustrates an exemplary in-line capacitance metrology system.

FIG. 1 illustrates an exemplary implementation of such an in-line noncontact capacitance metrology system 40. As shown in FIG. 1, the system 40 includes a housing 100 that supports two capacitance probe 102, an optional vertical position sensor 104, and a horizontal position sensor 106. In this exemplary implementation, the horizontal position sensor 106 includes a plurality of optical position sensors 106a-h. In some implementations, the capacitance probe 102 includes sensor heads 103a and 103b. The sensor heads 103a and 103b are on opposite sides of the substrate 10 and map both substrate 10 surfaces simultaneously.

Figure 2:
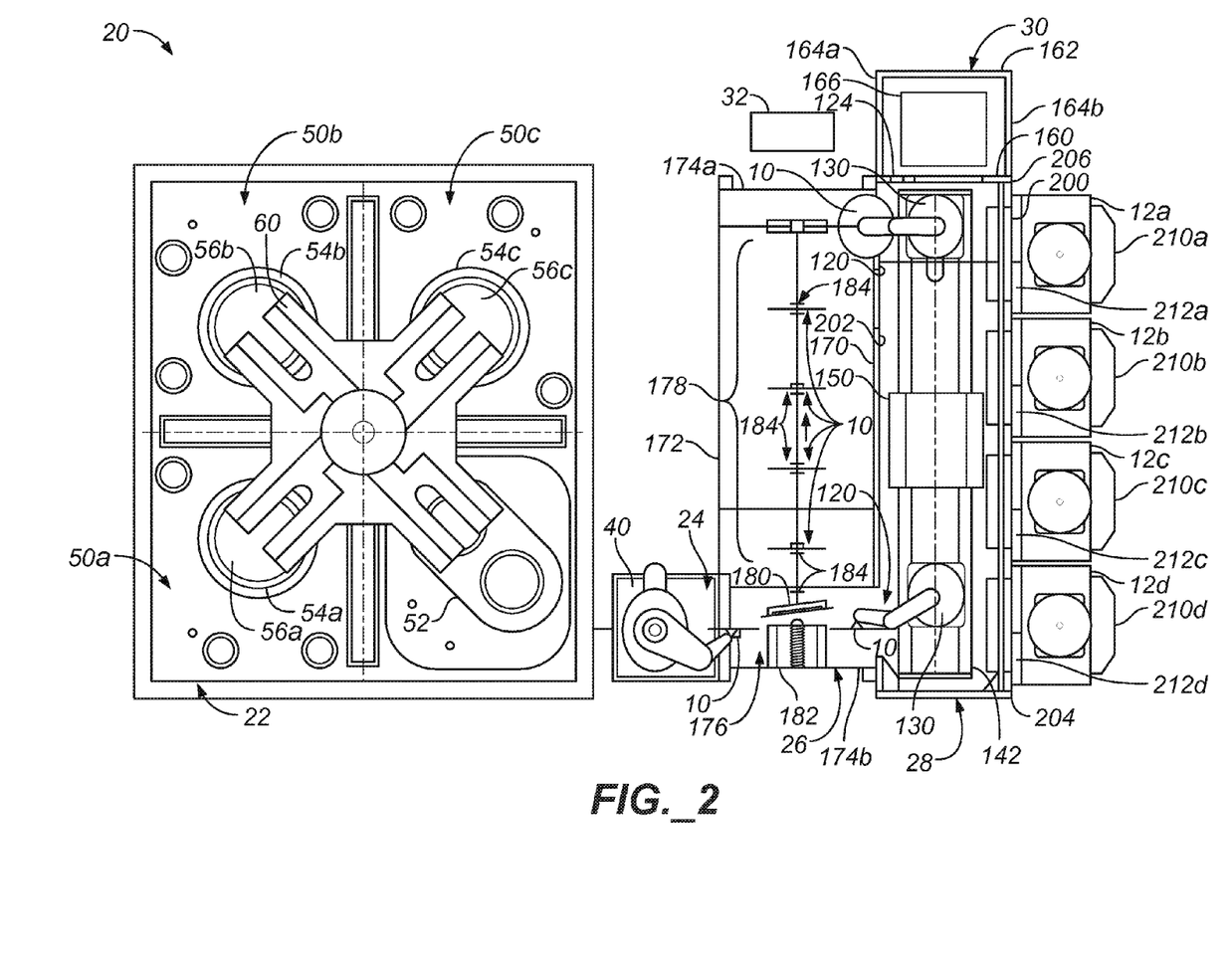
FIG. 2 illustrates an exemplary chemical mechanical polishing and cleaning system that includes the in-line capacitance metrology system shown in FIG. 1.

A substrate 10 can be introduced into the metrology system 40 in a generally horizontal position and moved laterally into the system 40, for example, by a robot (e.g., wet robot 24 as shown in FIG. 2) or other device designated for moving and/or manipulating substrates that may be included in a substrate processing system. During operation, the capacitance probe 102 progressively scans the substrate 10 as it is moved into the system 40.

The vertical position sensor 104 can be used to determine vertical distance 108 (i.e., the distance measured from the bottom of the vertical position sensor 104 to the top of the substrate 10 or to the substrate holder). The distance 108 (which may also be referred to as z-distance) is determined and fed to the robot and used by the robot to adjust the substrate vertical position to ensure a consistent distance of the top or the bottom of the substrate to the sensor head 103a and 103b. Capacitance sensing can be dependent on the distance between the substrate and the sensor head. For example, the distance 108 can vary due to wafer vibration. The vertical position sensor 104 may perform a measurement of the distance 108 before the substrate 10 is placed fully into the probe 100 and scanning is started. This could occur when the substrate edge 110 is detected by the position sensor 106a. The robot used to handle the substrate 10 can then be commanded to adjust the vertical position of the substrate 10. In some implementations, the robot used to handle the substrate 10 grips an edge of the substrate, such as a rounded edge of the substrate, to enable measuring of all points along the substrate surface.

The horizontal position sensor 106, in some implementations, can determine the lateral location of the substrate 10 at fixed positions within the system 40. For example, the horizontal position sensor 106 can track the lateral substrate movement of the substrate 10 from its initial entry into the system 40 to its ending position within the system 40. In some implementations, the position sensors 106a-h are located at fixed, predetermined locations within the system 40. Each position sensor can be equally spaced relative to the other position sensors.

The capacitance probe 102 senses the substrate 10 as it enters the system 40, taking continuous measurements of the substrate 10 at discrete points along the substrate 10. Capacitance between the sensor and the substrate and therefore the distance of one side of the substrate to the sensor can be determined at the discrete measurement points along the scanned radius of substrate 10. Sensor readings can be continually made as the substrate moves through the gap between the capacitance sensor heads. The substrate 10 can be a 200 mm diameter circular substrate, a 300 mm diameter circular substrate, or a substrate having another diameter. In some implementations, the substrate can be non-circular.

In some implementations, the position sensors 106a-h can be spaced 25 mm apart. During operation, the position sensor 106a detects the presence of the substrate edge 110. This detection can be used as an indication of the start of a substrate scan. Also, as described above, the substrate vertical position may now be adjusted. Next, the substrate is moved through the gap between the opposing sensor heads 103a, 103b. Capacitance sensor measurements of the substrate thickness are progressively taken as the substrate 10 passes through the capacitance probe 102. In addition, as the substrate is scanned, substrate edge 110 is detected by each successive position sensor 106b-106h. In some implementations, multiple capacitance sensor measurements are taken by the system 40 when the substrate 10 travels between each position sensor 106a-h. Capacitance sensor measurements can be taken at 1 mm increments along the substrate 10 during a predetermined time period so as to obtain a total of twenty-five capacitance measurements that span the 25 mm distance between each position sensor 106a-h.

In some implementations, this measurement process continues until substrate scanning stops, when a radius of the substrate (e.g., from substrate edge to center of the substrate) has been measured, when multiple angularly separated radial segments have been measured, or when a substantial number of locations near the substrate edge have been measured. In this example, assuming the substrate 10 is a 300 mm substrate, the system 40 scans the radius of the 300 mm substrate to obtain measurements at 150 measurement points (e.g., measured at each 1 mm).

A substrate processing system that can employ the in-line capacitance metrology system 40 is shown in FIG. 1 is depicted in FIG. 2. Referring to FIG. 2, the substrate processing system 20 includes a chemical mechanical polisher 22, a cleaner 26, a factory interface module 28, the in-line capacitance metrology system 40, a substrate transfer system 30, and a controller 32. A description of a similar substrate processing system can be found in U.S. Pat. No. 6,413,145, the entire disclosure of which is incorporated herein by reference in its entirety. In place of a chemical mechanical polisher 22, the system can include a substrate grinding apparatus (not shown).

In some implementations, the noncontact capacitance metrology system, includes a chuck for supporting a central portion of the substrate 10 while the capacitance measurements are made. In this system, an area surrounding the center of the substrate 10 is measured, such as by rotating the substrate. Upon completing measurements at one radial location along the substrate, the probes are moved to a new radial location. The center of the substrate can be measured by moving the substrate or the chuck so that a portion of the substrate between the center and the edge is supported by the chuck and the metrology system can access both sides of the substrate at a central portion of the substrate 10.

In alternative implementations of the noncontact capacitance metrology system, the substrate 10 is held in a stationary location and the capacitance probe 102 is on a pivotable arm or pair of pivotable arms. The sensor 102 is then moved along the surfaces of the substrate 10 while measurements are obtained. A controller records the location of the sensor 102 with respect to the stationary substrate 10. Fixed bars adjacent to the pivotable arms can provide a reference point for the sensor vertical location from the substrate 10 to determine the sensor location with respect to the fixed bars. The substrate 10 can be held along the edge to prevent inducing any shape to the substrate during measuring.

In some implementations, the sensor 102 only includes a single head 103a and opposite to the sensor head 103a is a conductive plate. In some implementations, the sensor is adjustable. The adjustable sensor is calibrated and then used to measure substrates as follows. A reference substrate of a known thickness is placed in the sensor 102, i.e., between sensor heads 103a, 103b. The sensor head positions are adjusted to measure the top and bottom of the reference substrate. The sensor heads can be positioned near the center of their measurement range to allow for positive or negative deviates from the reference measurement. The sensor outputs can be adjusted to zero volts. The reference substrate is replaced with the sample substrate. The thickness deviation can be determined from the deviation from zero volts from the two sensor heads. This method assumes that the sum of the sensor heads produce a linear change in voltage with respect to a change in substrate thickness. This method also assumes that the gap between the sensors is kept constant and that as the substrate is moved closer to one head and further from the other, the sum of the voltages of the two sensor heads remains constant. If the sensor heads are not positionally adjustable, the capacitance determined when the reference substrate is in the sensor is compared with the capacitance determined when the sample substrate is in the sensor.

Substrates 10, e.g., wafers, can be transported to the substrate processing system 20 in wafer cassettes 12 (e.g., cassettes 12a-12d, collectively referenced as wafer cassettes 12). The substrate transfer system 30 includes a factory interface robot 130 to move substrates from cassettes (e.g., wafer cassette 12) to a holding station 150 or from the output of the cleaner 26 back to the cassettes, and a wet robot 24 to move substrates between the holding station 150, the polisher 22, and the input of the cleaner 26. In some embodiments, the factory interface robot 130 includes a moveable stage. The substrates are extracted from the cassettes 12 by the factory interface module 28 for transport to the polisher 22, and the cleaner 26. The operations of the substrate processing system 20 can be coordinated by controller 32, such as one or more programmable digital computers executing distributed control software.

The in-line capacitance metrology system 40 can be in the factory interface module 28 or can be in a separate enclosure that is mounted to the factory interface module 28. In some implementations, the in-line capacitance metrology system 40 is located in an area near the cleaner 26 and the polisher 22, such as proximate the wet robot 24, although a different suitable location for the in-line capacitance metrology system 40 may be used. The wet robot 24 can be configured to position the substrate 10 into the capacitance metrology system 40. The wet robot 24 can hold the substrate 10 with a vacuum chuck or an arm having a gripper, and can be configured to extend and retract horizontally and vertically, as well as rotating about a vertical axis.

Alternatively, the substrate 10 could be laterally moved into the capacitance metrology system 40 by the factory interface robot 130. For example, the capacitance metrology system 40 could be located in the factory interface module 28, e.g., as part of the temporary storage 150 or as a system suspended in the interface module 28, or be a module 30 that abuts the factory interface module 28. The capacitance metrology system 40 could be place located in other locations in-line with the polishing system 22, and other robots or devices could move the substrates into the capacitance metrology system 40.

The controller 32 can be a digital computer connected to other components of the system 20, including the polishing system 22, as well as the in-line capacitance monitoring system 40. The controller 32 may be programmed to control the robot holding the substrate, e.g., wet robot 24, to move the substrate 10 through the monitoring system 40, to store substrate lateral and vertical position information in relation to the monitoring system 40 as determined by horizontal position sensor 106 and vertical position sensor 104, to store the signals received from the monitoring system 40, and to determine the distance of a surface of the substrate from the probes at different points on the substrate from the signals. In one implementation, the wet robot 24 can maneuver the substrate 10 to a correct position within the probe 100, and can move the substrate 10 laterally into the probe 100 at a determined rate of movement.

The in-line capacitance metrology system 40 can be configured to measure the thickness of the substrate 10 before and/or after polishing of the substrate 10 by the polisher 22. The substrate 10 can be transferred to the metrology system 40 by wet robot 24 at specific points during the polishing process to determine if further polishing of the substrate is needed.

Wet robot 24 may be similar to the factory interface robot 130, and can provide a wide range of motion to manipulate the substrate when transporting it between a staging section 176 and the polisher 22. For example, the wet robot 24 can be configured to position the substrate 10 into the capacitance metrology system 40. The wet robot 24 can hold the substrate 10 with a vacuum chuck or an arm having a gripper, and can be configured to extend and retract horizontally and vertically, as well as rotating about a vertical axis.

In some implementations, when the factory interface unit, polisher, cleaner and in-line capacitance metrology system are in a single integrated processing system, monitoring of the polishing of individual substrates can be performed as part of the standard set of processing steps performed at the processing system. In some embodiments, the capacitance metrology system is in the factory interface unit, for example, proximate to substrate storage units. In some embodiments, the capacitance metrology system is in a separate enclosure that is mounted onto the factor interface unit.

If the system includes a capacitance metrology system 40, a value for the vertical distance 108 can be sent to the controller 32 to calibrate the system. Calibration can ensure that when the wafer is introduced between the between the sensor heads 103a, 103b the wafer does not contact the sensor heads and is not scratched. In some embodiments, once the system is calibrated, the vertical distance 108 measurement is no longer required. The two sensor heads allow for determining the vertical distance. In some embodiments, the signal the vertical position sensor 104 is used to correct capacitance data to remove the vibrations from the data or to correct signal distortion.

As discussed previously, the capacitance probe 102 can sense the substrate 10 as the substrate 10 enters the system 40, taking a sequence of measurements of the substrate 10 at discrete points along a radius of the substrate. The controller 32 can receive these measurements, and can determine a corresponding substrate thickness associated with each discrete measurement point. For example, the capacitance metrology system 40 can scan a 300 mm substrate, and send signals and data to the controller 32 at 1 mm increments along the substrate 10. The signals and data can contain, for example, substrate lateral position information (e.g., 25 mm from an edge of the substrate), a capacitance voltage from the capacitance probe 102, and the vertical height of the substrate 10 or substrate holder with respect to the capacitance probe 102 (e.g., distance 108).

These signals and data points can be processed by signal processing algorithms to determine a substrate layer thickness measurement at each point measured along the substrate 10.

Figure 3:
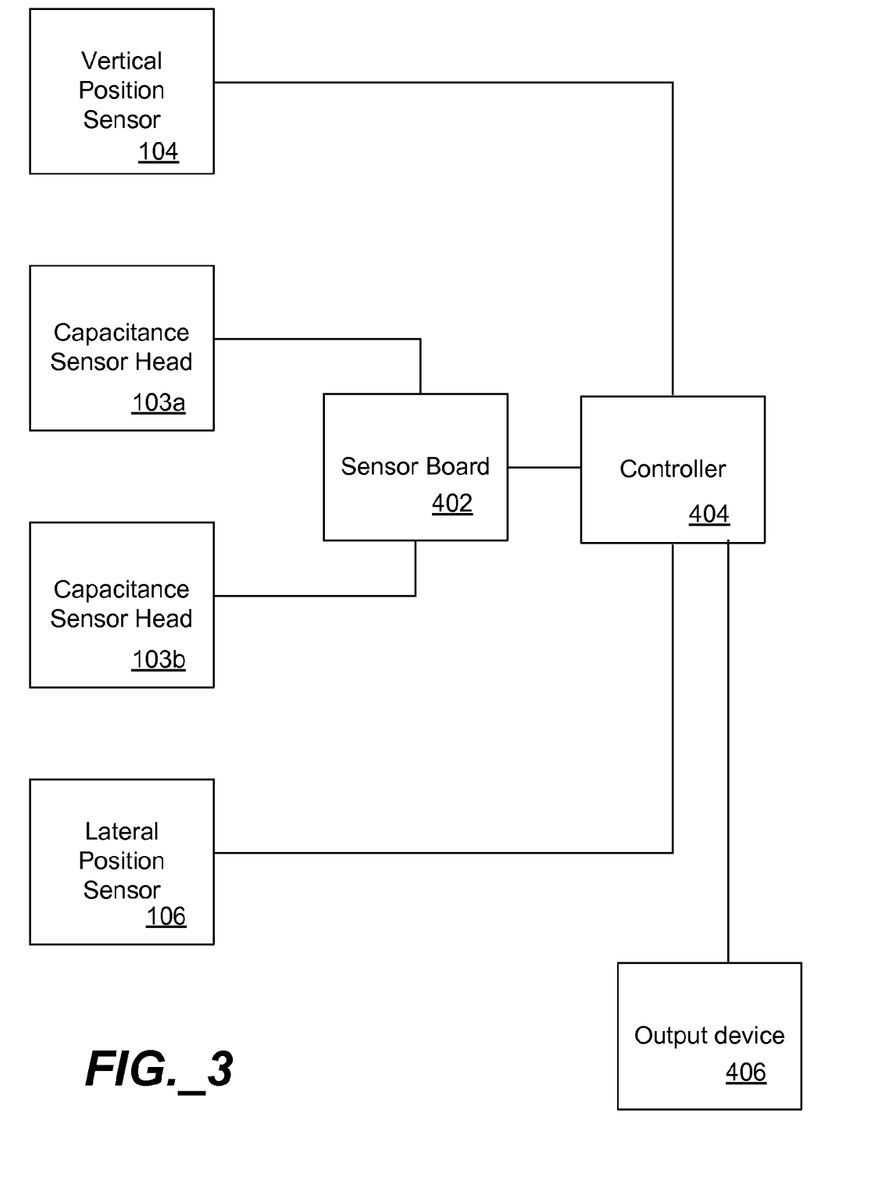
FIG. 3 is a block diagram of the exemplary in-line capacitance metrology system of FIG. 1.
Figure 4:
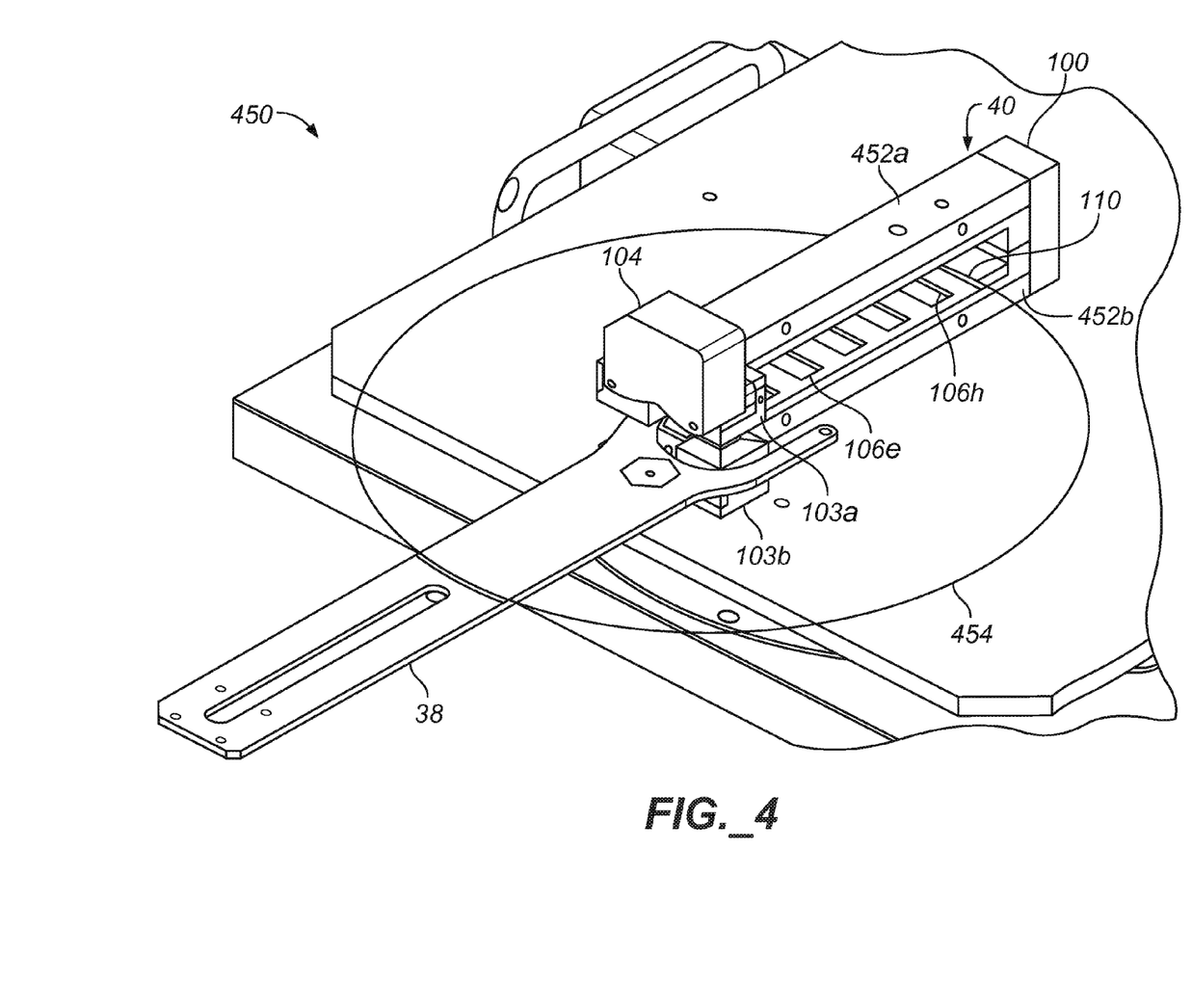
FIG. 4 is a perspective view of the exemplary in-line capacitance metrology system of FIG. 1.

FIG. 3 is a block diagram 300 of an exemplary in-line capacitance metrology system 40 of FIG. 1. FIG. 4 is a perspective view 400 of an exemplary in-line capacitance metrology system 40 of FIG. 1. Referring to FIGS. 3 and 4, the system 40 can include the capacitance probe 102, which includes sensor heads 103a, 103b that can be connected in either a serial or parallel circuit. The sensor heads 103a, 103b can be mounted on brackets 452a, 452b respectively, such that the heads 103a, 103b are spaced a predetermined distance from each other, forming a gap there between. The gap distance can be varied depending on the size of the substrate being measured. For example, a range for the gap in which a semiconductor wafer is introduced is about 2-6 mm for wafers having a thickness of between about 0.65-0.80 mm. This range can provide suitable spot size, signal strength and handling reliability in typical semiconductor processing applications.

The capacitance sensor heads 103a, 103b can be connected to a sensor board circuit 402, which can drive the sensor heads 103a, 103b. When a voltage is applied to a sensor head 103a or 103b and a substrate is adjacent to the sensor head, an electric field is produced between the head and the substrate. The sensor board circuit 402 changes the voltage on the sensor head. In some implementations, the sensor board circuit 402 determines the amount of current required to change the voltage, which indicates the capacitance between the sensor head and the substrate. Alternatively, the sensor board circuit can generate a current for driving the sensor heads and can detect the voltage change as the substrate is moved to determine the capacitance change are various points on the substrate surface. The sensor board circuit determining capacitance of both sides of the substrate can be used to determine substrate thickness. The voltage change can be transmitted to a controller 404, which can include an analog to digital converter for converting the voltage to a digital signal for processing, as will be described below. A suitable capacitance system is available from KLA Tencor, AFS 3220 FA Wafer Dimensional Metrology System.

The capacitance metrology system 40 can also include the array of position sensors 106a-h, which can detect the position of the substrate 10 as it is moved through the gap between the capacitance sensor heads 103a, 103b. The position sensors 106 can be connected to the controller 404, which can determine the sampling locations on the substrate when thickness measurements are made. In some implementations, a position sensor can be an optical sensor, such as a through-beam type sensor. Examples of suitable position sensors can include the model EX-11 sensor commercially available from SUNX of Japan.

Alternatively, the capacitance metrology system 40 does not include position sensors 106a-h. The position of the wafer can be obtained from the robot encoder of the robot used to move the wafer through the system.

In some implementations, the vertical position sensor 104 (which can also be referred to as a z-position sensor) can measure the distance between the substrate 10 and the sensor heads 103a, 103b to determine a distance related compensation factor that can be applied to raw data generated by the capacitance probe 102 to compensate for distance and vibration effects. Examples of suitable vertical position sensors can include a laser distance sensor. Examples of such a sensor can include the model XZ-30V sensor commercially available from OMRON of Japan.

The controller 404 can compute the thickness, flatness or bowing, of the substrate at various sampling locations based on respective readings from the sensors 106. In some implementations, the controller 404 can include an analog to digital converter, a PLC (Programmable Logic Control), and a PC (personal computer). The analog to digital converter can convert analog signals from the capacitance probe 102 and the vertical position sensor 104 to digital form for processing. The PLC can receive sensing signals from the sensors 106 and can perform data logging or collection functions. The PC can receive data from the PLC and can perform measurement and compensation calculations. In some implementations, the measurement results can be output to an output device 406 (e.g., a computer display or printer). In some implementations, the controller 404 may feed data to or be a part of the controller 32 (as shown in FIG. 1), which can also control the movement of the wet robot 24 in the substrate processing system 20. The wet robot 24 can maneuver the substrate 10 to a correct position within the probe 100, and can move the substrate 10 laterally into the probe 100 at a determined rate of movement.

Various methods can be used for computing the thickness of the substrate 10 from the capacitance sensor readings. For example, one such method can use empirical data of capacitance sensor readings taken of particular substrates having known thicknesses to generate sensor reading calibration curves. Capacitance sensor readings can then be mapped to calibration curves to determine the thickness of measured substrates. Compiling all of the distances of the sides of the substrates from the probes with the locations at which the measurements are taken can provide a thickness of the substrate.

For example, referencing FIG. 1 and FIG. 4, the capacitance metrology system 40 can be used to determine the thickness of a substrate 10. The wafer can be positioned on an end effector 38 connected to a robotic arm (e.g., the wet robot 24 of FIG. 2). The robotic arm can then be actuated to move the wafer through the gap formed by the pair of capacitance sensor heads 103a, 103b. As the wafer moves through the gap formed by the pair of capacitance sensor heads 103a, 103b, it passes the array of position sensors 106, which can be successively tripped or actuated by the leading edge (e.g., substrate edge 110) of the wafer. A sensing routine can be triggered when the wafer passes the first position sensor 106a. The sensing routine can include the capacitance probe 102 taking periodic thickness readings (e.g., at a sampling rate of 1,000 readings/second), and the position sensors 106 detecting when the wafer edge (e.g., substrate edge 110) passes each successive sensor to determine the velocity of the wafer. Using this information, the controller 404 can determine the measured thickness at each sampling location and the position of each sampling location on the wafer. In this manner, thickness measurements can be taken along a given line extending across the wafer. Measurements along different lines across the wafer can be taken, if desired, by rotating the wafer to a desired position and then moving it through the system 40 while making measurements.

In some implementations, the capacitance metrology system 40 can take measurements on-the-fly, i.e., while the wafer is being moved through the gap between the sensor heads 103a, 103b. High sampling rates can then be possible, allowing the wafer thickness to be quickly measured. The system can obtain at least 3 points, such as 29 points along a single radius of the substrate. While more measurements can be obtained, up to 10,000, fewer measurements can be selected, such as between 50 and 600, for example, around 300 or 150 on wafer and 50 off wafer. More measurements take more time and slow down processing time. The sufficient number of measurements depends on the incoming wafer quality. In some cases, more measurements can be obtained in known non-flat regions. In some implementations, a wafer having a diameter of about 300 mm can be measured in about two seconds, at about 2,000 sampling points. In other implementations, different sampling rates can be used resulting in more or less sampling points corresponding to shorter or longer measurement times, respectively.

In some implementations, quick and accurate measurements of the substrate can allow for corrective action to be taken, if needed, to obtain a desired polishing thickness. For example, if a generally uniform substrate thickness is desired and the measurements indicate that the thickness is not sufficiently uniform, the wafer can be subjected to selective chemical mechanical polishing, electrochemical mechanical polishing, or other processes to obtain the desired uniform thickness. In some implementations, for example, the controller 404 may be programmed to adjust the polishing process of the polisher 22 based on the measured layer thickness of the substrate 10, or the controller 404 may feed data to the controller 32 to perform this function. The polishing process of polisher 22 may be adjusted by modifying, for example, the backside pressure applied to the substrate during polishing or the rotational rate of the carrier head or the platen during polishing. In some systems, the backside pressure at different zones, either radial or angular, can be adjusted independent of other zones. Other parameters of the polishing process can also be modified, such as slurry delivery rate, temperature or polishing time. In other implementations, a single controller may be used to perform functions related to controlling capacitance metrology system 40 and other portions of substrate processing system 20.

The thickness of the substrate can be measured prior to polishing of the wafer. For example, the controller 404 can receive the signals from the sensor board 402 associated with the distance of each side of the substrate from the sensors. The controller 404 can use the data to adjust the polishing parameters or the polishing endpoint algorithm of the polisher 22. Alternatively or in addition, the thickness of the substrate can be measured after polishing of the substrate. The controller 404 can use the signal to adjust the polishing parameter or endpoint algorithm for subsequent substrates. In some implementations, the controller 404 can feed the sensor data to controller 32 which can control the substrate processing system 20 for the polishing of the substrate.

Figure 5:
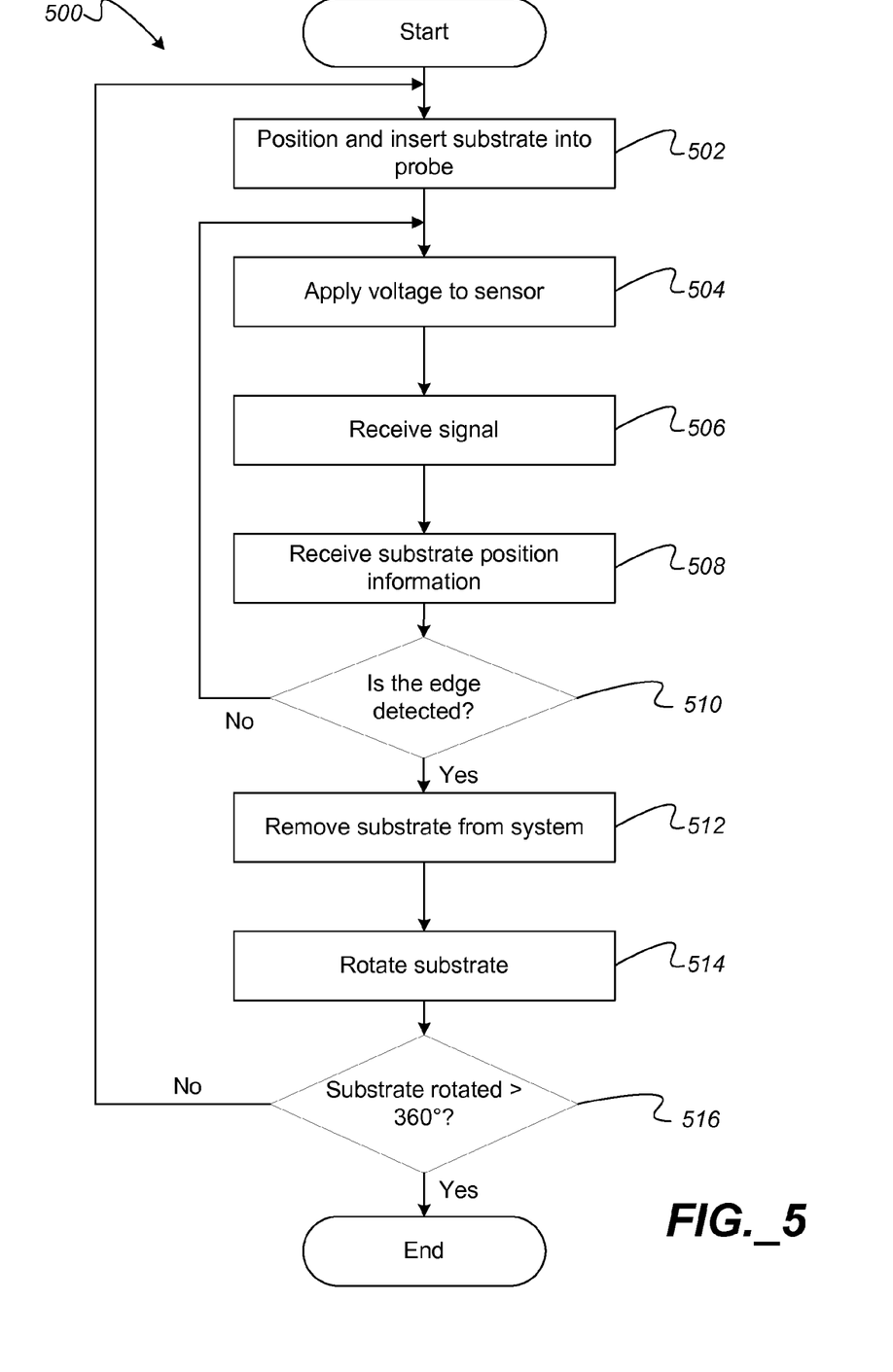
FIG. 5 is an exemplary flow chart for determining a thickness of a substrate.

FIG. 5 is a flow chart of a method 500 for monitoring the thickness of the substrate. The method 500 can be performed in the capacitance metrology system 40, which is part of the substrate processing system 20, shown with reference to FIG. 1 and FIG. 2. The method 500 begins by positioning the substrate 10 proximate to the capacitance system 40 and inserting the substrate 10 into the system 40 (502). For example, the substrate 10 can be handled by the wet robot 24. As the wet robot 24 moves the substrate 10, a voltage is applied to the capacitance probe 102, where each sensor head with the applied voltage acts as a first plate of a capacitor and the substrate acts as a second plate of the capacitor as the substrate 10 passes the capacitance probe 102 (504). The controller 48 receives a signal (506) which can be used to determine the distance of a side of the substrate from the sensor at that measurement location.

Next, the controller 48 receives substrate position information from the in-line capacitance metrology system 40 (508). If the substrate edge 110 is not detected (510), scanning is continued (504). If the substrate edge 110 is detected (510), the wet robot 24 removes the substrate from the system 40 (512). The wet robot 24 rotates the substrate 10 by an angle, a (514). The angle, a, is a predetermined number of degrees of rotation in a counterclockwise direction. If the substrate 10 is rotated 360 degrees from the first radius scan of the substrate 10 (516), the method 500 ends. If the substrate 10 has not been fully rotated 360 degrees (516), the method 500 continues (502).

In an alternate implementation of the method 500, the wet robot 24 is the factory interface robot 130 or another similar device used to grasp, move, and/or rotate a substrate within a substrate processing system. In another alternate implementation, the substrate 10 is rotated in a clockwise direction.

Figure 6:
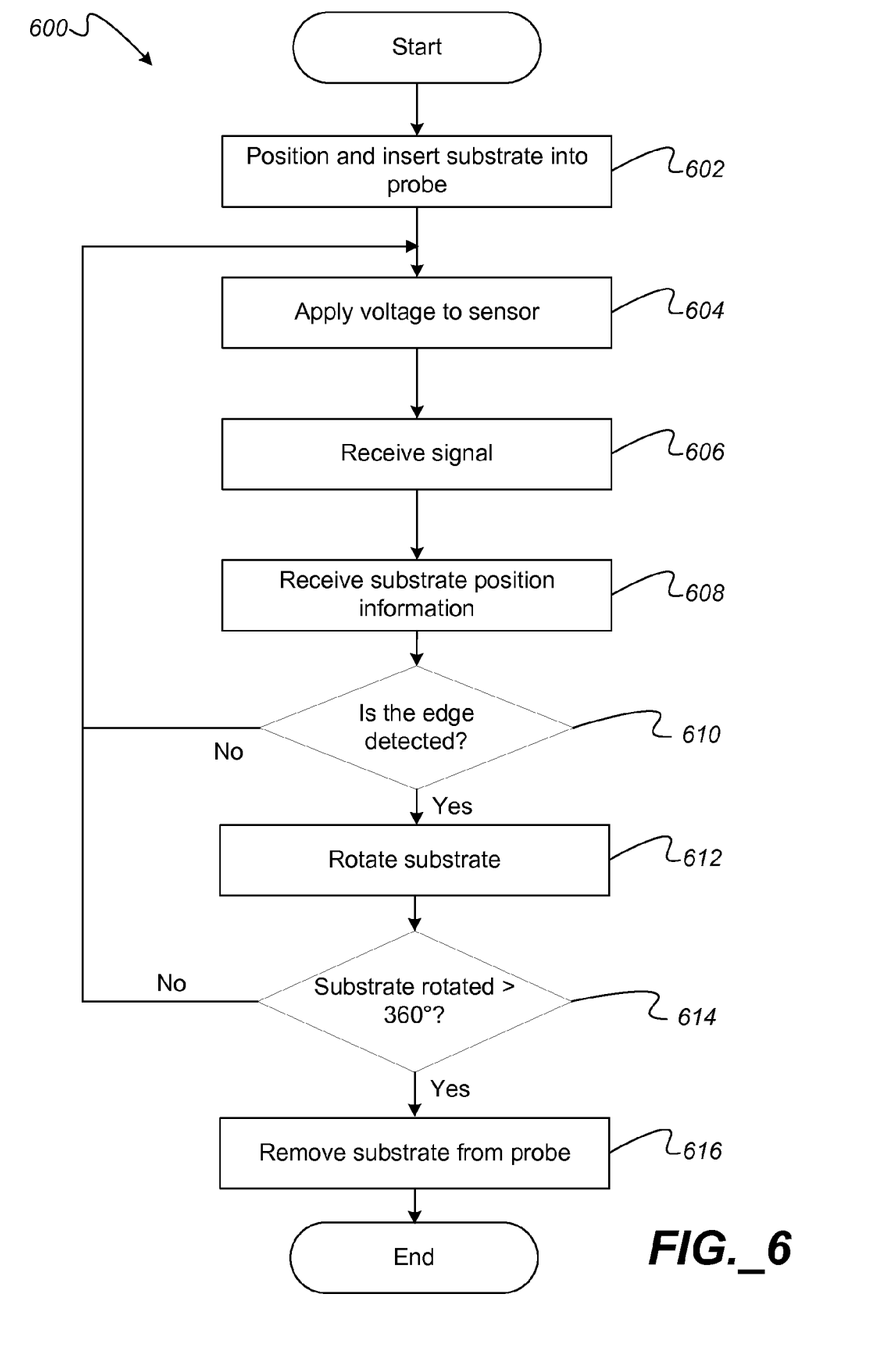
FIG. 6 is an exemplary flow chart of an alternative method for determining a thickness of a substrate.

FIG. 6 is a flow chart of an alternative method 600 for monitoring the thickness of a substrate. Essentially steps 602-610 are identical to steps 502-510 performed in the method 500. However, rather than removing the substrate 10 from the system 40 upon the detection of the substrate edge, the substrate 10 is rotated by an angle, a (612). The angle, a, is a predetermined number of degrees of rotation in a counterclockwise direction. If the substrate 10 has been rotated 360 degrees from the first radius scan of the substrate 10 (614), the wet robot 24 removes the substrate 10 from the probe 100 of system 40 (616). Unlike the method shown in FIG. 5, the substrate 10 remains in the probe 100 until a number of measurements have been obtained.

The speed of movement of a manipulative handling mechanism (e.g., wet robot 24) used to move the substrate into and out of the system 40 can be optimized for minimum vibration level and constant speed during substrate scans.

The substrate can be scanned at various radial and x,y positions along the surfaces of the substrate. Moreover, if the substrate is rotatable by the robot, then scanning can be performed along an arc, particularly an arc near the substrate edge where axial thickness variations are more likely to occur. Combining the distance from the lower sensor head and the upper sensor head at a single location on the substrate results in a substrate thickness and distance from the sensors, which can provide thickness information. Comparing the distance from the lower sensor head at different points along the bottom of the substrate and the distance from the upper sensor head at different points along the top of the substrate can indicate whether the substrate is flat, bows or warps in any locations.

Figure 7:
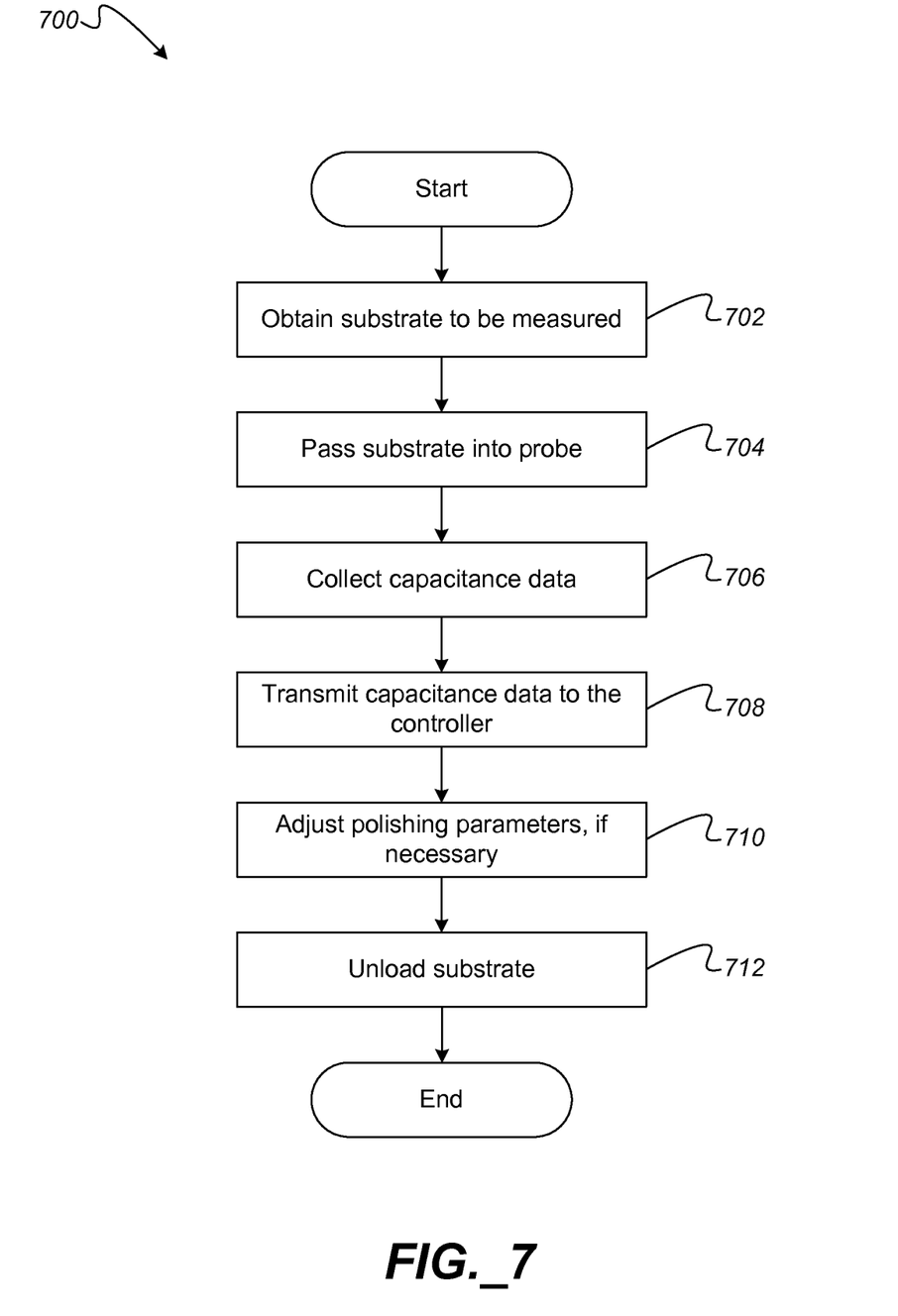
FIG. 7 is an exemplary flow chart for a method performed by a system that includes an integrated capacitance metrology system.

Referring to FIG. 7, a method 700 of measuring the substrate is described. A robot, such as the factory interface robot obtains the substrate that is to be measured (702). The substrate can be either obtained from a front opening unified pod (FOUP) of the factory interface, or at the cleaner output. The substrate is passed under the probe in a predetermined trajectory (704). The predetermined trajectory can be an arc, a spiral, along one or more radii of the substrate, or at predetermined x,y locations. The probe collects capacitance data of the substrate (706). The capacitance data is electronically transmitted to the controller (708). The controller adjusts the polishing parameters, such as pressure, rotational speed, time, etc.) to achieve a target removal thickness or post polishing thickness, if changes are necessary (710). The factory interface robot unloads the substrate (712), such as at a polisher or into the FOUP.

Figure 8:
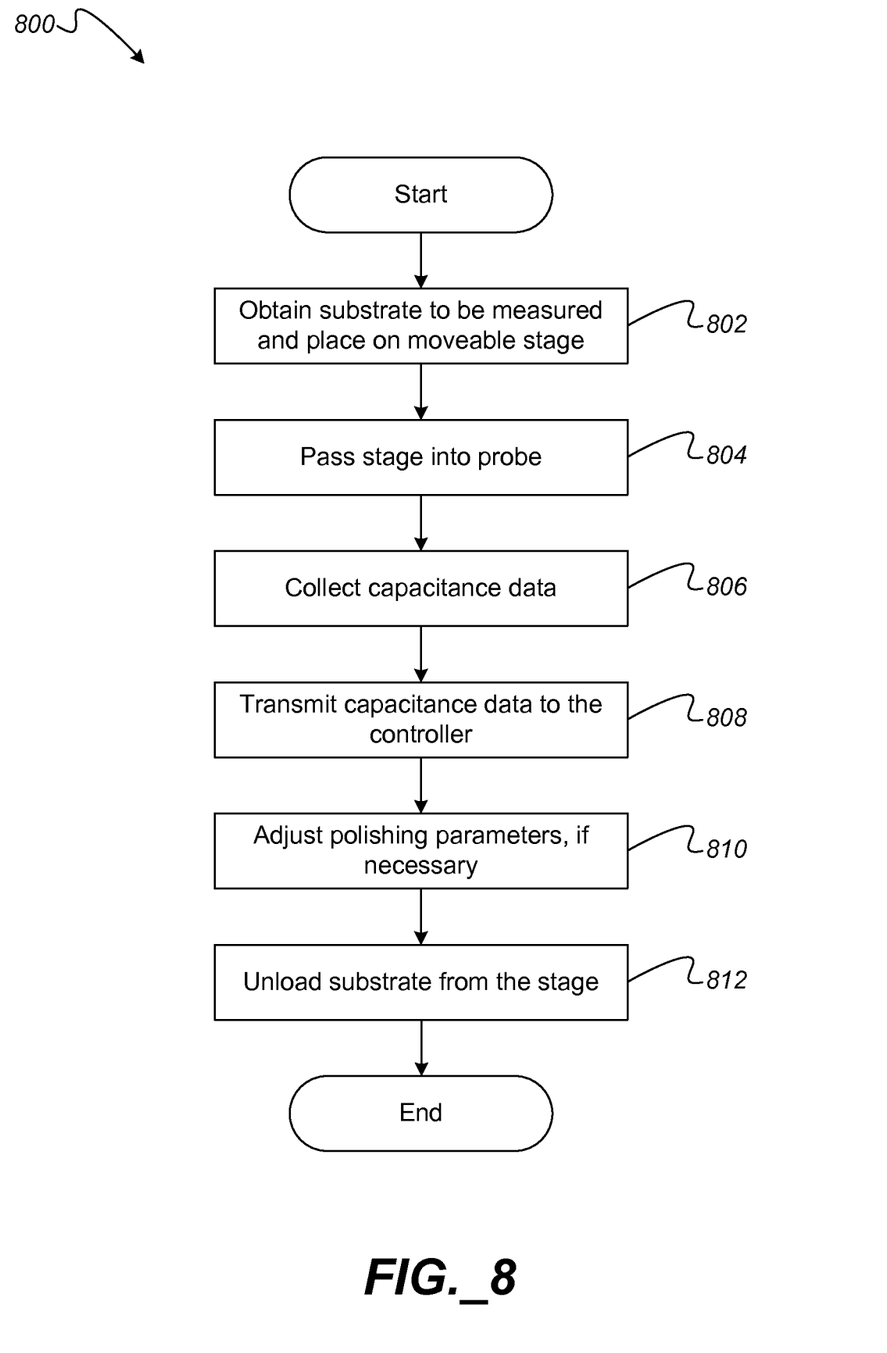
FIG. 8 is an exemplary flow chart for an alternative method performed by a system that includes an integrated capacitance metrology system.

Referring to FIG. 8, an alternative method 800 of measuring a substrate is described. A robot, such as the factory interface robot obtains the substrate that is to be measured and places the substrate on a moveable stage within an enclosure housing the FOUP and the stage (802). The substrate can be either obtained from the FOUP or the cleaner output. The stage passes the substrate under the probe in a predetermined trajectory (804). The predetermined trajectory can be an arc, a spiral, along one or more radii of the substrate, or at predetermined x,y locations. The probe collects capacitance data of the substrate (806). The capacitance data is electronically transmitted to the controller (808). The controller adjusts the polishing parameters, such as pressure, rotational speed, time, etc.) to achieve a target removal thickness or post polishing thickness, if changes are necessary (810). The factory interface robot unloads the substrate from the stage (812), such as at a polisher or into the FOUP.

The substrate thickness can be used to determine modifications that should be made to polishing parameters for that substrate at a next polishing step or for a next substrate that is to be polished. That is, the substrate thickness information can be used in a feed back or feed forward manner. For example, the thickness measurements taken at the various radii along the substrate surface can be averaged together within various radial zones (particularly the edge zone) to obtain average values that take into account the angular variations of the substrate thicknesses within that zone, thus providing a more accurate measurement of the substrate layer thickness. Using the average thickness, polishing can be adjusted to ensure that the substrate achieves a desired planarized thickness.

Although the polishing of a circular substrate is usually axially symmetric, there can be angular variations in the polishing rate. The angular variations in the polishing rate can be more pronounced at the substrate edge. This effect can result in the angular variation of substrate thickness along the edge of the substrate. This variation, or unevenness of the substrate thickness, can affect the accuracy of determination of the thickness substrate or whether a layer has been uniformly removed from the substrate. In particular, if a monitoring system measures at only one radial segment through the substrate edge, it is possible that the measurement will be made in a region that varies from the average thickness at the substrate edge. If the measured substrate thickness is used to determine the amount of polishing needed by the substrate or control the polishing apparatus, this thickness variation can result in the overpolishing or underpolishing of the substrate.

The substrate can be scanned, for example, by an in-line capacitance monitoring system, as will be described below, that can generate a signal related to the distance of one side of the wafer from the probe. Measurements can be performed at multiple angularly separated regions, particularly at multiple angularly separated points near the substrate edge. In one implementation, multiple scans are performed along angularly separated radial segments of the substrate.

The thickness values of the multiple angularly separated points within a given radial range can be averaged together to determine an average thickness value for each radial zone of the substrate. This average value (including measurements from multiple angularly separated points within the radial range) can then be used for process control. For example, if the thickness of the substrate is measured before polishing, then the average value, particularly the average thickness value for the substrate edge, can be used to control the polishing system (e.g., the pressure applied by the carrier head) for a subsequent substrate to reduce wafer-to-wafer non-uniformity.

Alternatively, the thickness values can be kept separate for angular analysis of the substrate. For example, if the substrate is being measured after polishing to determine the thickness of the substrate, then using multiple measurements spaced angularly about the substrate edge can improve reliability in determining that the desired thickness has been achieved.

As described with reference to FIG. 1, the vertical distance 108 of the substrate 10 within the system 40 can be calibrated. The calibration can be performed to locate the substrate within the probe 40 at an optimized position, where the capacitance measurement output is minimized. During calibration, multiple substrate scans can be performed for multiple vertical distance positions to calibrate the height compensation algorithm.

Substrates of known thickness can be scanned by the system 40 to correlate the capacitance measured to the distance of the substrate to the sensor head. The thickness range of the calibration substrate wafers can be used to define the range of measurement of the system 40.

Factors that can affect the calibration of the system 40 may be related to material variation on the substrate. Metal and semiconductor layers will provide a different capacitance than dielectric layers.

The capacitance metrology system 40 can be located proximate to a measuring station, where the substrate is held in a substrate holder at the measuring station either prior to or subsequent to polishing the substrate. Referring to FIG. 2, the in-line capacitance metrology system 40 can be located in the area of the wet robot 24. This location is advantageous if a substrate is scanned after polishing, because it is located close to the polisher and little time elapses before the measurement is performed. In an implementation where a capacitance measurement is used to modify one or more processing parameters for polishing a subsequent substrate, this location allows for more rapid feedback to the polisher 22. The location is also functional if a substrate is scanned prior to polishing. Ideally, the substrate surface is dry to obtain accurate capacitance measurements. Thus, the substrate can be measured pre-CMP or post cleaning and drying after CMP.

Another possible location for the in-line capacitance system metrology 40 is in the factory interface module 28. Locating an capacitance monitoring system in factory interface module 28 may be convenient when measuring a substrate prior to polishing. The factory interface robot 130 can place a substrate into the in-line capacitance metrology system 40 before placing the substrate in the storage station 50. The controller 34 can correlate the substrate data to its location in the storage station 50. Another possible location for the in-line capacitance system metrology 40 is in a module directly attached to the factory interface module 28.

Another possible location for the in-line capacitance monitoring system 40 is in the storage station located in the factory interface module. The system 40 can be located above the slots that hold the substrates. The factory interface robot 18 can place a substrate into the in-line capacitance metrology system 40 before placing the substrate in a slot. The controller 34 can correlate the substrate data to its location in a storage station.

Another possible location for the in-line capacitance metrology system 40 can include the input storage station and the output storage station in a cleaner. The capacitance metrology system 40 may be located proximate to the transfer station of the polisher 22, or at another location in the polisher 22 where the thickness of a substrate region or the location of the surfaces of the substrate may be measured prior to and/or subsequent to polishing the substrate rather than during polishing.

In some implementations, a second capacitance metrology system 40 may be included at a second location in the system 20. For example, the system 40 may be located at a holding station, and may be used to measure the thickness of one or more substrates subsequent to polishing. An additional capacitance metrology system may be located in the factory interface module 28, and may be used to measure the thickness of one or more substrates prior to polishing. The two measurements may be compared. The system 40 and any additional system may share some elements, such as a controller 30, and/or part or all of the drive system.

The in-line capacitance metrology system 40 has several potential advantages. The system 40 provides a non-contact measurement technique that is suitable for semiconductor substrate. The manipulative handling mechanism used to move the substrate within the probe 100 can move the substrate more slowly across the capacitance probe 102 than in an in-situ monitoring process. Consequently, the probe 102 can be capable of a high spatial resolution. For example, a scanning resolution of one data point per millimeter is possible. Nonetheless, the manipulative handling mechanism used to move the substrate within the probe 100 of the system 40 can move the substrate sufficiently quickly under the probe 102 throughput of the polisher is not affected. For example, the wet robot 24 can move a substrate into the gap between sensor heads 103a, 103b 100 mm (the radius of a 200 mm substrate) in less than one second. The number of radii scanned will determine the duration of the substrate scanning process. The system can provide for process control for polishing each substrate. The substrates can each be polished so that each substrate in a batch has the same thickness. Additionally or alternatively, the substrates can be polished to obtain a consistent thickness across a diameter of the individual substrate. The flatness, bow or warp, i.e., the profile, of the substrate can also be determined. To determine the profile, is assumed that either the back or the front of the substrate is flat. The assumed flat side is used as a reference plane. The thickness measurements are then used in combination with the reference plane to determine the profile of the substrate.

In some implementations, the capacitance metrology system is not in-line with the polisher. The measurements obtained by the capacitance metrology system are communicated to a controller, such as over a network, for example, over an Ethernet connection, or wirelessly. The measurements are then used by the controller to determine whether polishing parameters should be modified to obtain a desired thickness and uniformity of the substrate. If polishing process parameters need to be modified for that substrate, the controller makes the necessary modifications when the substrate is being polished.

The system can be simple, robust and inexpensive. The system can be positioned in an existing part of the polishing system, and consequently does not require a change to the layout of the polishing system or an increase in the footprint. The collected thickness data can be used to adjust the polishing process of the substrate being measured, or the polishing process of one or more subsequent substrates.

A number of implementations have been described. Nevertheless, it will be understood that various modifications may be made without departing from the spirit and scope of the invention. Accordingly, other implementations are within the scope of the following claims.

What is claimed is:

1. A method of forming substrates, comprising:
    polishing a bare silicon substrate in a polishing apparatus having one or more polishing stations for polishing of the substrate, the polishing stations operating with a plurality of polishing parameters;
    moving the substrate with a robot to a position adjacent to a probe, wherein the probe is either in a factory interface with substrate storage or mounted to the factory interface;
    receiving the substrate and scanning the substrate with the probe at one or more locations, wherein the scanning includes measuring the bare silicon substrate, wherein measuring is performed by a non-contact capacitance measurement device to obtain a signal at a point on the substrate, the measurement device being a capacitance sensor to induce a capacitance at each location and generate the signal, the signal indicative of a distance of the substrate from the probe for a corresponding location, wherein a vertical distance from a vertical position sensor to the bare silicon substrate is measured to ensure the bare silicon substrate does not contact the non-contact capacitance measurement device;
    communicating the signal or a thickness indicated by the signal to a controller configured to receive the signal and control at least one of the plurality of polishing parameters in response to the signal;
    determining an adjusted polishing parameter according to the signal or thickness indicated by the signal; and
    after determining the adjusted polishing parameter, performing the polishing of the bare silicon substrate in the polishing apparatus using the adjusted polishing parameter.

2. The method of claim 1, further comprising receiving a desired thickness of the substrate, wherein determining the adjusted polishing parameter is based on the desired thickness.

3. The method of claim 1, wherein measuring includes measuring at least three points along a radius on the substrate.

4. The method of claim 1, wherein measuring includes measuring at least three points in an angular zone on the substrate.

5. The method of claim 1, wherein the adjusted polishing parameter includes a relative rate of rotation between the substrate and a polishing surface.

6. The method of claim 1, wherein the adjusted polishing parameter includes backside pressure applied to the substrate.

7. The method of claim 1, wherein measuring and polishing are performed on a system where the non-contact capacitance measurement device is in-line with the polishing apparatus.

8. A system, comprising:
a polishing apparatus having one or more polishing stations for polishing of a substrate, the polishing stations operating with a plurality of polishing parameters;
an in-line monitoring system including:
  a substrate holder to hold the substrate at a place away from the polishing stations,
  a probe for receiving the substrate and scanning the substrate at one or more locations, the probe including:
    a capacitance sensor to induce a capacitance at each location and generate a signal indicative of a distance of the substrate from the probe for a corresponding location, and
    a vertical position sensor to determine a vertical distance from the vertical position sensor to the substrate to ensure that the substrate does not contact the capacitance sensor,
    wherein the capacitance sensor and the substrate holder are configured to undergo relative motion to position the capacitance sensor at three or more separated positions adjacent a substrate edge and generate measurements at the three or more separated positions;
a robot for moving the substrate adjacent to the probe;
a controller configured to receive the signal from the capacitance sensor and control at least one of the plurality of polishing parameters in response to the signal; and
a factory interface with substrate storage, wherein the in-line monitoring system is within the substrate storage of the factory interface.

9. The system of claim 8, wherein the sensor and the substrate holder are configured to undergo relative motion to scan the sensor along three or more separated radial segments of the substrate.

10. The system of claim 8, wherein the sensor comprises two capacitance sensors opposite to one another.

11. A chemical mechanical polishing system, comprising:
a polishing apparatus having one or more polishing stations for polishing of a substrate, the polishing stations operating with a plurality of polishing parameters;
a probe for receiving the substrate and scanning the substrate at one or more locations, the probe including:
a capacitance sensor to induce a capacitance at each location and generate a signal indicative of a distance of the substrate from the probe for a corresponding location; and
a vertical position sensor to determine a vertical distance from the vertical position sensor to the substrate to ensure that the substrate does not contact the capacitance sensor;
a robot for moving the substrate adjacent to the probe;
a controller configured to receive the signal and control at least one of the plurality of polishing parameters in response to the signal; and
a factory interface with substrate storage, wherein the probe is either in the factory interface or mounted to the factory interface.

* * * * *